(12) United States Patent
Chen et al.

(10) Patent No.: US 10,145,898 B2
(45) Date of Patent: Dec. 4, 2018

(54) BATTERY SIGNATURE IDENTIFICATION SYSTEM

(71) Applicant: Active-Semi, Inc., Tortola (VG)

(72) Inventors: Wayne Chen, Plano, TX (US);
Lawrence Blackledge, Dallas, TX (US)

(73) Assignee: Active-Semi, Inc. (VG)

( * ) Notice: Subject to any disclaimer, the term of this patent is extended or adjusted under 35 U.S.C. 154(b) by 476 days.

(21) Appl. No.: 14/809,136

(22) Filed: Jul. 24, 2015

(65) Prior Publication Data

US 2016/0047861 A1 Feb. 18, 2016

Related U.S. Application Data

(60) Provisional application No. 62/038,012, filed on Aug. 15, 2014.

(51) Int. Cl.
*H02H 3/00* (2006.01)
*G01R 31/36* (2006.01)
*H02J 7/00* (2006.01)

(52) U.S. Cl.
CPC ..... *G01R 31/3606* (2013.01); *G01R 31/3679* (2013.01); *H02J 7/0021* (2013.01); *H02J 7/0029* (2013.01); *H02J 2007/0001* (2013.01)

(58) Field of Classification Search
USPC .......................................................... 361/78
See application file for complete search history.

(56) References Cited

U.S. PATENT DOCUMENTS

| | | | | |
|---|---|---|---|---|
| 2007/0123316 A1* | 5/2007 | Little | ...................... | G06F 21/31 455/573 |
| 2011/0029157 A1* | 2/2011 | Muzaffer | .............. | H02J 7/0047 701/2 |
| 2013/0030991 A1* | 1/2013 | Neidlinger | ............ | G07F 15/006 705/39 |
| 2013/0069658 A1* | 3/2013 | Rich | ..................... | H01M 10/48 324/426 |
| 2014/0201853 A1* | 7/2014 | Wilson | .................... | G06F 21/81 726/36 |

(Continued)

*Primary Examiner* — Ronald W Leja
(74) *Attorney, Agent, or Firm* — Imperium Patent Works; Amir V. Adibi (57) ABSTRACT

A system for authenticating a rechargeable battery and for detecting counterfeit batteries includes battery characteristics detection circuitry and a battery. Battery characteristics detection circuitry performs an authentication routine on the battery such that battery characteristics of the battery are measured. Battery characteristics include state of health, state of charge, internal resistance, relaxation time, and impedance. The battery is validated by comparing the battery characteristics to validation parameters provided by a manufacturer. If battery characteristics are within ranges of the validation parameters, then the battery is authenticated as originating from a particular manufacturer or batch. If validation fails, then the device is disabled or protected. In one example, validation parameters are stored and compared locally on a device. In another example, the device communicates battery characteristics to a remote entity that performs the validation. In another example, the device receives validation parameters from the remote entity and performs the validation locally.

19 Claims, 8 Drawing Sheets

(56) References Cited

U.S. PATENT DOCUMENTS

| | | | |
|---|---|---|---|
| 2014/0225620 A1* | 8/2014 | Campbell | B60L 11/1838 324/426 |
| 2014/0229129 A1* | 8/2014 | Campbell | H04Q 9/00 702/63 |
| 2016/0047861 A1* | 2/2016 | Chen | G01R 31/3606 361/78 |

* cited by examiner

BATTERY SIGNATURE IDENTIFICATION SYSTEM

CLAIM OF PRIORITY UNDER 35 U.S.C. § 119

This application claims the benefit under 35 U.S.C. § 119 of U.S. Provisional Application Ser. No. 62/038,012, entitled "Battery Signature Identification System," filed Aug. 15, 2014, the subject matter of which is incorporated herein by reference.

TECHNICAL FIELD

The present invention relates generally to rechargeable batteries and, more particularly, to identifying the manufacturer of rechargeable batteries.

BACKGROUND

Top tier manufacturers of rechargeable batteries, particularly lithium-ion (Li-Ion) and lithium-polymer batteries, are concerned with the damaging effects of counterfeit batteries. There are inherent hazards in the operation of Li-Ion batteries in that if they are over-charged, charged too quickly, or otherwise used beyond their rated capabilities, the batteries can over-heat. Overheated batteries can melt the surrounding housing or nearby items in the devices they are powering. In the worst case, the batteries can catch fire or explode.

As counterfeit batteries can be more cheaply manufactured without the appropriate quality checks in place, the top tier battery manufactures are concerned that their brands will be tarnished if consumers believe that the overheating batteries originated from the top tier manufacturers. This could ruin a manufacturer's public image. In addition, world transportation organizations are concerned that counterfeit batteries could catch fire or explode while being used in commercial airplanes. Indeed, there is a real possibility that rechargeable external battery packs (Power Banks) will not being allowed on flights.

The top tier manufacturers have already begun to place identification marks on their batteries to reduce the chances of being counterfeited. These schemes, however, currently involve markings with special paper, which can be circumvented by counterfeiters. Therefore, it is desirable to have a way to authenticate batteries so that counterfeit batteries and their associated problems can be avoided.

SUMMARY

In various exemplary embodiments, the electrical and chemical characteristics of a battery are used as a signature to identify the manufacturer and/or the manufacturing lot to which the battery belongs. Similar manufacturing batches of batteries have similar characteristics. In addition, these electrical and chemical characteristics vary in a predictable manner with temperature. For any given temperature, one or more of the following characteristics can be determined: (i) the state of charge of the battery versus the terminal voltage of the battery, (ii) the state of health of the battery versus the terminal voltage of the battery, (iii) the relaxation time of the battery, and (iv) the internal resistance or impedance of the battery terminals for a given current.

The relaxation time of a battery is the amount of time required after a current pulse is supplied to the battery for the voltages across the battery terminals to decay to a predetermined voltage level. The relaxation time of the battery can be used to derive the state of charge of the battery.

The state of charge of a battery is a parameter that indicates the level of electrical charge available in the battery. This parameter may be based upon the total available charge storage in the battery. But the amount of charge storage in the battery may change as the battery ages.

The state of health of a battery can be measured based on the battery's ability to hold a charge, the number of cycles that remain available, and/or other parameters relating to the battery's remaining lifetime. Many of these parameters are compared to the initial "fresh" state of the battery.

For each of the characteristics listed above, there is a known predetermined range of values that is representative of batteries in each manufacturing lot, which of course have a common chemistry and design. It should be noted that the battery characteristics are not limited to those described above such that other types of battery characteristics can be measured and used in accordance with the exemplary embodiments.

The predetermined ranges of values can be obtained empirically by battery testing or simulation. The ranges can also be determined through theoretical calculations of the battery chemistry or by mathematical modeling of the battery chemistry. A parametric description of the battery is thereby obtained through the use of the battery characteristics.

By measuring one or more of these characteristics over a few charging and discharging cycles, it is possible to quantify these characteristics for a particular type of battery even if the characteristics were not provided by the battery manufacturer. For more information on measuring battery characteristics, see the two articles "Rapid Charging of Lithium-Ion Batteries using Pulsed Currents," by Landau et al, Journal of Electrochemical Society 2006, and "Cycle Life Modeling of Lithium-ion Batteries," by Ning et al, Journal of Electrochemical Society 2004, the subject matter of which is incorporated herein by reference. A system and circuitry is disclosed that obtains the signatures of batteries by determining selected electrical and chemical characteristics through charging and discharging the batteries in order subsequently to authenticate the batteries.

Other embodiments and advantages are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

DETAILED DESCRIPTION

Reference will now be made in detail to exemplary embodiments of the invention, examples of which are illustrated in the accompanying drawings.

Figure 1:
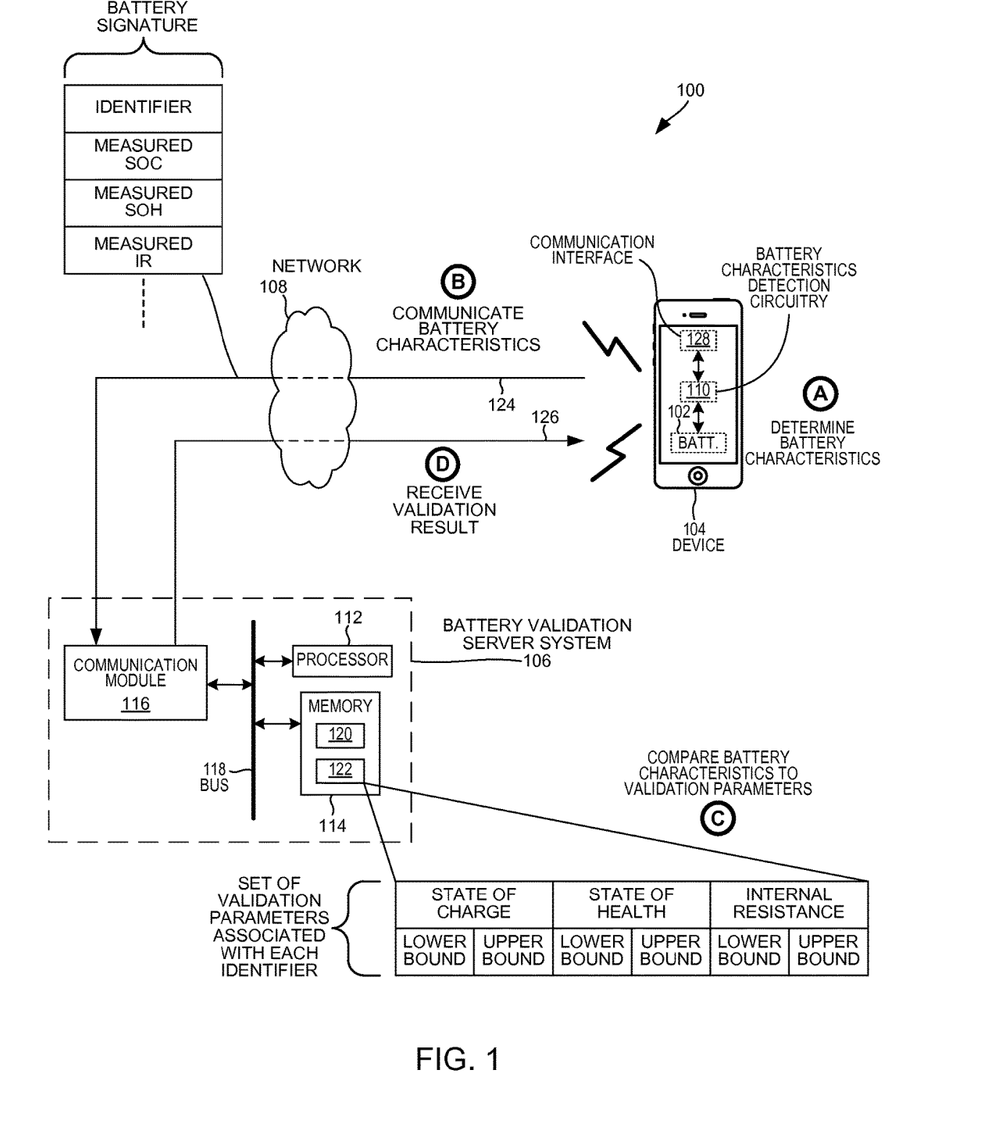
FIG. 1 is an exemplary embodiment of a system that authenticates the origin of a battery.

FIG. 1 is an exemplary embodiment of a system 100 that authenticates the origin of a battery 102. The system 100 includes device 104, battery validation server system 106, and network 108. The device 104 includes the battery 102, battery characteristics detection circuitry 110, communication interface 128, and other device circuitry (not shown). In this embodiment, device 104 is a mobile communication handset. In another embodiment, device 104 is another type of portable electronic device that is supplied by a rechargeable battery, such as a portable audio system, an image/video capture device, or a portable printer system.

The battery 102 supplies power to circuitry internal to device 104. In an exemplary embodiment, the battery 102 is a rechargeable battery. The battery 102 is of any suitable chemistry to enable recharging of the battery and to provide adequate supply voltage to power the circuitry within the device 104. In the example of FIG. 1, the battery 102 is a rechargeable Lithium-Ion battery included within the device 104. In another embodiment, the battery is outside the housing and external to the device 104.

The battery validation server system 106 includes processor 112, memory 114, communication module 116, and communication bus 118. The processor 112, the memory 114, and the communication module 116 communicate using communication bus 118. In an exemplary embodiment, the memory 114 stores an amount of processor executable instructions 120, a plurality of validation parameters 122, and any other suitable data and/or instructions. Processor 112 is configured to read and execute the amount of executable instructions 120 from memory 114. Executing instructions 120 causes processor 112 to receive battery characteristics received by communication module 116 from device 104, compare the received battery characteristics to validation parameters 122 stored in memory 114 to validate that the battery is authentic and not counterfeit, and to send the validation results to device 104 via the communication module 116.

In an exemplary embodiment, the processor 112 comprises at least one of a CPU, state machine, processor, logic, or other elements that may include memory and/or other hardware resources. The processor 112 operates to receive battery characteristics of battery 102 from device 104 via the network 108 and communication module 116. In an exemplary embodiment, the battery characteristics include a device identifier and/or battery identifier. Next, the processor 112 compares the received battery characteristics to the validation parameters 122 stored in the memory 114. In an exemplary embodiment, the device/battery identifier is used to select the appropriate validation parameters from the memory 114. Next, the processor 112 communicates the validation results to device 104 via the network 108 and the communication module 116. For example, if the battery characteristics are within a specified range of the validation parameters, then a positive validation result is returned. If the battery characteristics are outside a specified range of the validation parameters, then a negative validation result is returned The memory 114 comprises RAM, ROM, EEPROM, or any other suitable type of memory element. The memory 114 stores validation parameters 122 used to validate battery 102 within the device 104. The validation parameters 122 includes a range of battery characteristics each having a lower and upper bound for each type of battery that is to be validated. Each set of validation parameters 122 corresponds to a type of battery provided by a particular battery manufacturer. If the received battery characteristics of battery 102 are within the range of battery characteristics for a specific battery type in the validation parameters 122, then the battery 102 is successfully validated.

The communication module 116 comprises hardware or hardware executing software that allows the system 106 to communicate over network 108. The communication module 116 provides an interface between the device 104 and the battery validation server system 106. The communication module 116 may employ any other computational element or hardware resource configurable to communicate over an Internet Protocol (IP) network or cellular handset network.

During operation, device 104 is powered on. Initially ("A"), the battery characteristics detection circuitry 110 determines battery characteristics of the battery 102. Battery characteristics include one or more of state of health, state of charge, internal resistance of the battery, and/or any other characteristics used to characterize chemical or electrical properties of the battery 102. The battery characteristics detection circuitry 110 determines the battery characteristics by measuring current, voltage, and temperature of the battery 102 during (or after) at least one charge and/or discharge cycle. In a charge cycle, charge is supplied onto battery 102, whereas in a discharge cycle, charge is drawn out of battery 102.

Next ("B"), the battery characteristics of the battery 102 determined by the battery characteristic detection circuitry 110 are communicated to the battery validation server system 106. The battery characteristics are communicated from communication interface 128 of the device 104 to the battery validation server system 106 via network 108. Communication of the determined battery characteristics is shown at 124. The communication module 116 of the battery validation server system 106 receives the battery characteristics. In an exemplary embodiment, the battery characteristics include an identifier that can be used to select the appropriate validation parameters at the server system 106.

Next ("C"), processor 112 compares the received battery characteristics to validation parameters 122 stored in memory 114 and sends the validation results to device 104 via the communication module 116. The validation parameters 122 are selected based on the identifier associated with the received battery characteristics. If the battery characteristics are within the range of battery characteristics described by the validation parameters 122 for a specific battery type identified by (or associated with) the identifier, then the battery 102 is successfully validated. If, on the other hand, the battery characteristics are not within the range of battery characteristics described by the validation parameters 122, then the battery 102 fails validation. The processor 112 communicates the validation results (pass/fail) to the device 104 via the network 108 using the communication module 116.

Next ("D"), the device 104 receives the validation results from the battery validation server system 106. The validation results are received onto the communication interface 128 of the device 104 via network 108. Reference numeral 126 identifies the communication of the validation results. If the validation results indicate that the battery is from a specified (or valid) manufacturer and/or manufacturing lot, then the device 104 is enabled and proceeds to normal operation. If, however, the validation results indicate that the battery is not from a specified (or valid) manufacturer, then the device 104 is disabled or enters a protection mode.

In another exemplary embodiment, the battery validation server system 106 is incorporated into the device 104 such that local validation can occur within the device 104. In this embodiment, the processes described above occur without requiring communications utilizing the network 108.

In still another exemplary embodiment, the battery validation server system 106 is incorporated into the device 104 such that local validation can occur within the device 104. However, in this embodiment, the network 108 is utilized to retrieve validation parameters from an external entity, such as the validation server system 106. Once the validation parameters are retrieved from the server system 106, the device performs the validation process locally to determine validation result.

Figure 2:
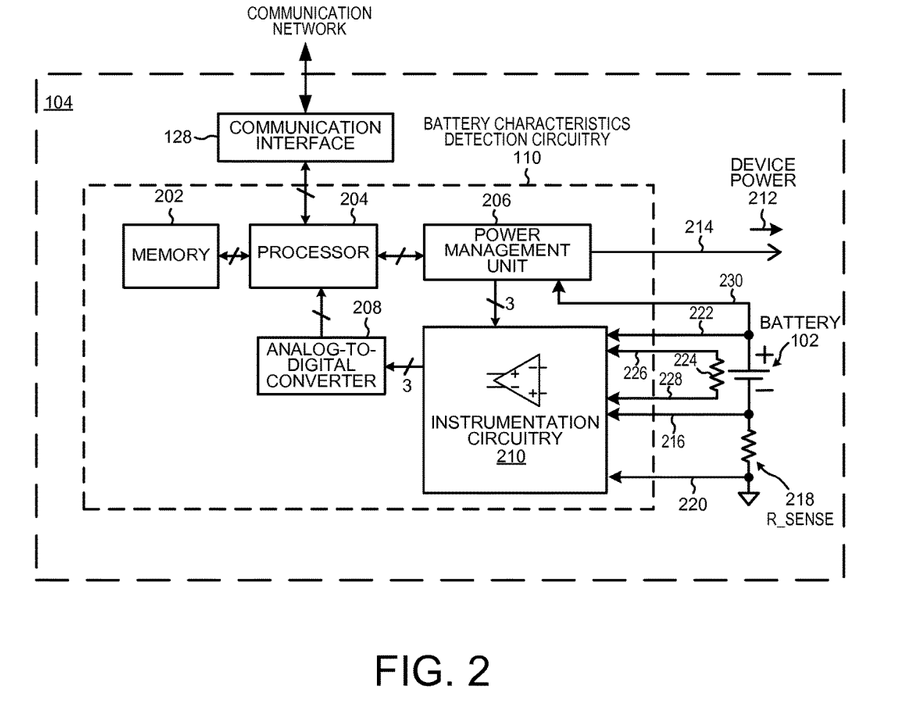
FIG. 2 is a detailed exemplary embodiment of battery characteristics detection circuitry shown in FIG. 1.

FIG. 2 is a detailed exemplary embodiment of the battery characteristics detection circuitry 110 shown in FIG. 1. The battery characteristics detection circuitry 110 comprises memory 202, processor 204, power management unit (PMU) 206, analog-to-digital converter (ADC) 208, and instrumentation circuitry 210. The battery characteristics detection circuitry 110 is used for parametric measurement thereby determining the battery characteristics to be used for battery validation. The battery characteristics detection circuitry 110 can be either integrated onto one semiconductor die or implemented with discrete components. The battery characteristics detection circuitry 110 is part of the device 104 that includes the battery 102, communication interfaces (if needed), connectors, and a power supply (or supplies if needed).

The memory 202 comprises RAM, ROM, EEPROM, or any other suitable type of memory element. The memory 202 stores battery parameters, device/battery identifiers, control code, algorithm code, and any other information, instructions or parameters. Battery parameters stored in memory 202 include temperature measurements, voltage measurements, current measurements, relaxation time information, and any other information involved in determining battery characteristics of the battery 102. The memory 114 also stores battery characteristics to be validated. The battery characteristics stored in memory 114 include state of health estimations, state of charge estimations, internal resistance estimations, relaxation time, and any other battery characteristics that are involved in validation.

The processor 204 comprises at least one of a CPU, state machine, processor, logic, or other computational elements that may include memory and/or other hardware resources. The processor 204 operates to control PMU 206 for data collection. The processor 204 receives measurement information from ADC 208. After receiving measurement information, processor 204 perform further processing to obtain battery characteristics. The processor 204 stores the determined battery characteristics in memory 202.

The PMU 206 comprises one or more of voltage regulators, current regulators, battery charging circuitry, driver circuitry, timers, registers, switches, multiplexers, amplifiers, and any other suitable hardware involved in controlling operation of the battery 102. The PMU 206 is used to charge and discharge the battery 102 via node 230. The PMU 206 outputs and supplies device power 212 onto node 214 thereby supplying the internal circuitry of the device 104.

The ADC 208 includes driver circuitry, timers, registers, switches, multiplexers, amplifiers, and any other suitable hardware involved in monitoring battery characteristics. The ADC 208 is used to monitor the charging or discharging current, the temperature of the battery 102, and the voltage on the battery terminals.

The instrumentation circuitry 210 is used to measure the temperature, voltage, and current across the battery 102. The instrumentation circuitry 210 is coupled to a first terminal of a temperature sense resistor 224 via node 226 and to a second terminal of the temperature sense resistor 224 via node 228. The instrumentation circuitry 210 is coupled to the positive voltage terminal of battery 102 via node 222. The instrumentation circuitry 210 is also coupled to the negative voltage terminal of battery 102 via node 216 and to a first terminal of a current sense resistor 218. The instrumentation circuitry 210 is also coupled to the ground node 220 and to a second terminal of the current sense resistor 218. The instrumentation circuitry 210 is controlled by the PMU 206. The resulting measurements are supplied from the instrumentation circuitry 210 to the ADC 208.

During operation, the processor 204 controls the PMU 206 to measure selected battery characteristics of the battery 102 using the instrumentation circuitry 210. The measurements made by the instrumentation circuitry 210 are digitized by the analog-to-digital converter 208 and the digital results are input to the processor 204. The processor 204 then performs either a local or remote validation process to determine whether or not the battery 102 originated from a specified manufacturer and/or manufacturing lot.

Figure 3:
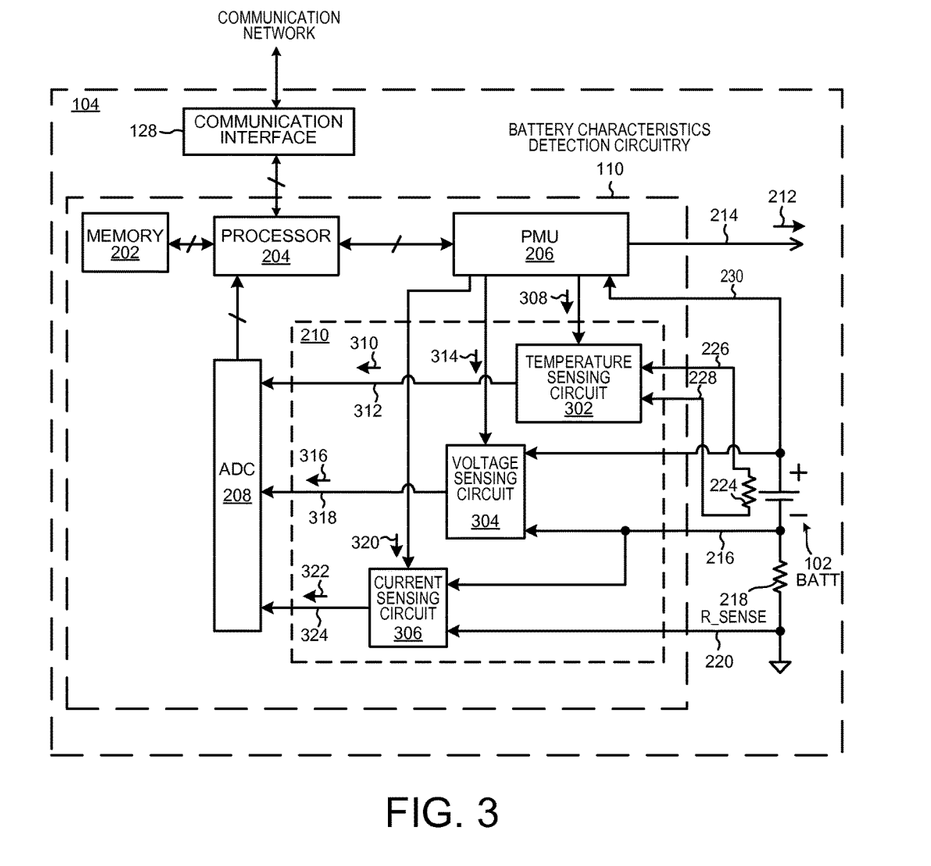
FIG. 3 is a detailed exemplary embodiment of instrumentation circuitry shown in FIG. 2.

FIG. 3 is a detailed exemplary embodiment of the instrumentation circuitry 210 shown in FIG. 2. The instrumentation circuitry 210 comprises temperature sensing circuit 302, voltage sensing circuit 304, and current sensing circuit 306.

The temperature sensing circuit 302 is configured to sense temperature of the battery 102. The temperature sensing circuit 302 receives a control signal 308 from the PMU 206 thereby controlling how and when temperature information is measured. The temperature sensing circuit 302 generates and outputs a signal 310 indicative of battery temperature onto the ADC 208 via node 312.

The voltage sensing circuit 304 is configured to sense voltage between the positive and negative terminals of the battery 102. The voltage sensing circuit 304 receives a control signal 314 from the PMU 206 thereby controlling how and when voltage is measured. The voltage sensing circuit 304 generates and outputs a signal 316 indicative of voltage between battery terminals of the battery 102 onto the ADC 208 via node 318.

The current sensing circuit 306 is configured to sense current across the battery 102 through sense resistor 218. The current sensing circuit 306 receives a control signal 320 from the PMU 206 thereby controlling how and when current information is measured. The current sensing circuit 306 generates and outputs a signal 322 indicative of current across the battery 102 onto the ADC 208 via node 324.

During operation, the ADC 208 digitizes the analog signals at its input to generate digital values representing battery temperature, battery voltage and battery current that are input to the processor 204.

Figure 4:
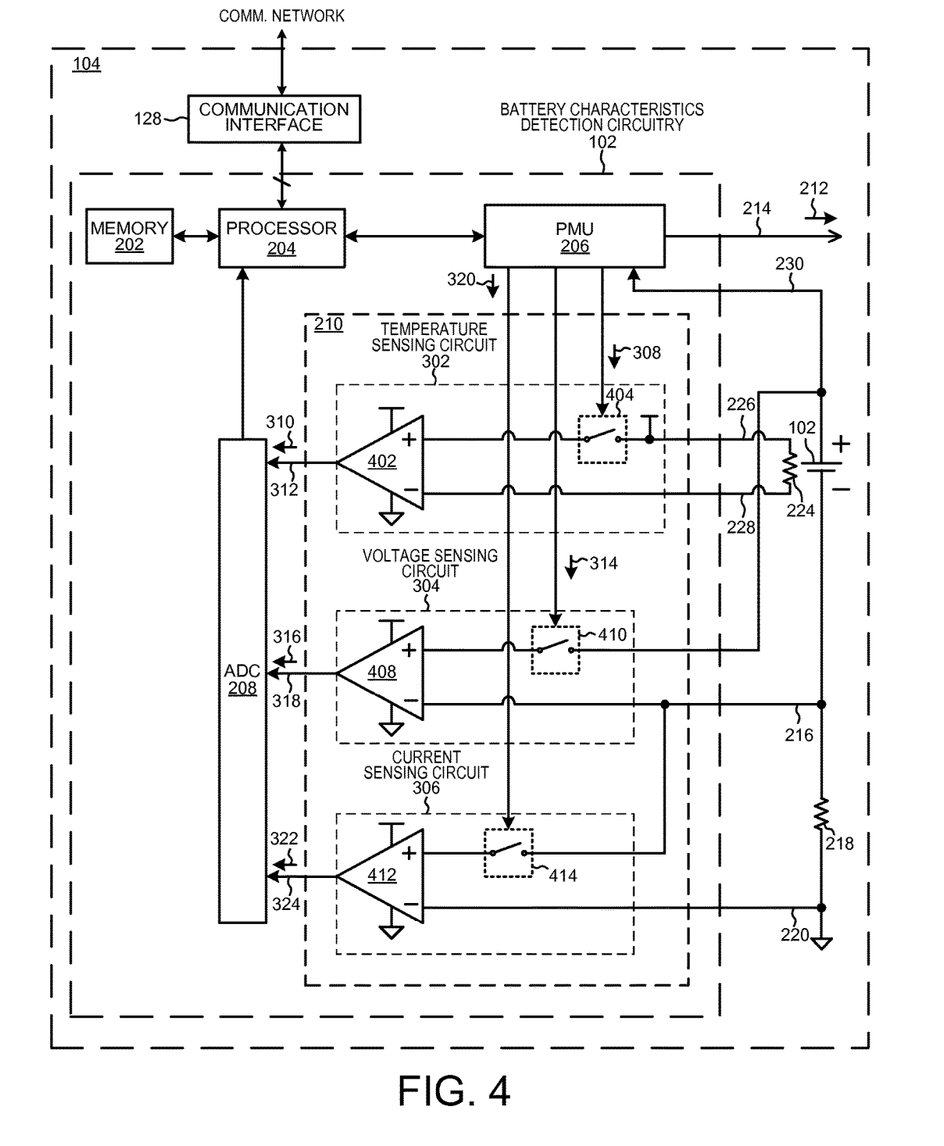
FIG. 4 is a detailed exemplary embodiment of a temperature sensing circuit, a voltage sensing circuit, and a current sensing circuit shown in FIG. 3.

FIG. 4 is a detailed exemplary embodiment of the temperature sensing circuit 302, the voltage sensing circuit 304, and the current sensing circuit 306 shown in FIG. 3.

The temperature sensing circuit 302 comprises an amplifier 402 and a switch 404. The temperature sensing circuit 302 is coupled to the first terminal of the temperature sense resistor 224 via node 226 and to the second terminal of the temperature sense resistor 224 via node 228. Control signal 308 controls the switch 404. The resistance of temperature sense resistor 224 varies proportionally with temperature.

The temperature measured by the sense resistor 224 is indicative of battery temperature because the sense resistor 224 is located in close proximity to the battery 102. When switch 404 is controlled to be enabled (closed), the amplifier 402 senses a voltage across temperature sense resistor 224 and outputs the signal 310 indicative of temperature of the battery 102. The amplifier 402 supplies the output signal 310 onto the ADC 208 via the node 312.

The voltage sensing circuit 304 comprises an amplifier 408 and a switch 410. Control signal 314 controls the switch 410. When the switch 410 is controlled to be enabled (closed), the amplifier 408 senses the voltage between the positive and negative terminals of the battery 102 and outputs the signal 316 indicative of the voltage across battery 102. The amplifier 408 supplies the output signal 316 onto the ADC 208 via the node 318.

The current sensing circuit 306 comprises an amplifier 412 and a switch 414. Control signal 320 controls the switch 414. When the switch 414 is controlled to be enabled (closed), the amplifier 412 senses the voltage drop across current sense amplifier 218 and outputs the signal 322 indicative of the current across battery 102. The amplifier 412 supplies the output signal 322 onto the ADC 208 via the node 324. In an alternative embodiment, the current sense resistor is connected between the positive terminal of the battery 102 and the PMU 206.

Figure 5:
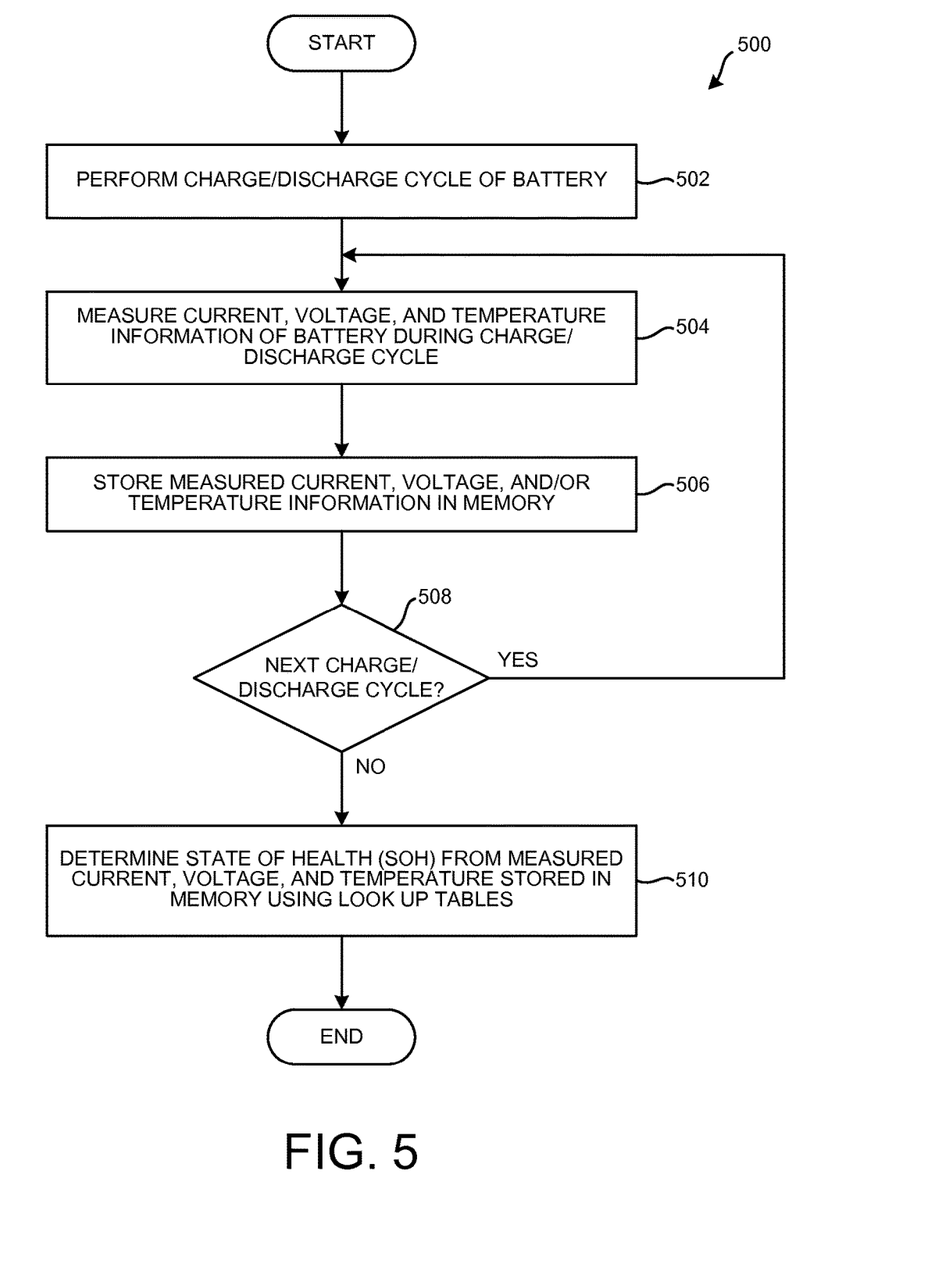
FIG. 5 shows an exemplary embodiment of a method for determining state of health of a battery.

FIG. 5 shows an exemplary embodiment of a method 500 for determining state of health of a battery. For example, the method 500 is suitable for use with the battery characteristics detection circuitry 110 to determine a SOH characteristic of the battery 102. State of health represents the total remaining charge or discharge cycles the battery can sustain before failure. Thus, the state of health is an indicator of the remaining life of the battery before the battery should be replaced. The state of health estimation is typically represented as a numeric percentage value. In one example, the battery characteristics detection circuitry 110 estimates the state of health of the battery 102 in accordance with the method 500 as set forth below.

At block 502, perform one or more charge or discharge cycles of a battery. During a charge cycle, charge is supplied to and stored in the battery. During a discharge cycle, charge is drawn out of the battery and supplied to a load. For example, the PMU 206 controls the battery 102 to be charged or discharged by a selected amount for a selected duration. For example, the PMU 206 performs a charge cycle by applying a charging voltage/current received from an external charger to the battery 102. The PMU 206 performs a discharge cycle by connecting the output of the battery 102 to an internal load that discharges the battery's power. Both the charging and discharging cycles are performed for selected time durations.

At block 504, current, voltage, and temperature information of the battery are measured after the charge or discharge cycle of the battery. In other embodiments, only current and voltage are measured. For example, in FIG. 4, the PMU 206 connects the battery 102 output to a selected internal load and the amplifier 412 of the current sensing circuit 306 measures current information of the battery 102 via current sense resistor 218. The amplifier 408 of the voltage sensing circuit 304 measures voltage between the positive and negative terminals of the battery 102. The amplifier 402 of the temperature sensing circuit 302 measures temperature of the battery 102 via temperature sense resistor 224.

At block 506, the measured current, voltage, and temperature information of the battery are stored in memory. For example, in FIG. 4, the processor 204 receives the current information of the battery 102 from ADC 208 and stores the current information in memory 202. The processor 204 receives the voltage information of the battery 102 from ADC 208 and stores the voltage information in memory 202. The processor 204 receives the temperature information of the battery 102 from ADC 208 and stores the temperature information in memory 202.

At block 508, a determination is made whether to enter another charge or discharge cycle to obtain additional battery measurements. In one embodiment, at least three charge or discharge cycles are utilized in method 500. By measuring battery information over more charge or discharge cycles, the accuracy of the SOH battery characteristic estimation is increased. If additional battery measurements are to be obtained, then the method 500 proceeds to block 504. If no additional battery measurements are to be obtained, then the method 500 proceeds to block 510 for processing of the stored measurements. For example, in FIG. 4, the processor 204 determines whether or not to obtain additional current, voltage, and temperature information of the battery 102.

At block 510, the state of health of the battery is determined from the measured current, voltage, and temperature information stored in memory. The state of health is determined by comparing known state of health numeric percentage values for the given current, voltage, and temperature information. In one embodiment, lookup tables having state of health values for the measured current, voltage, and temperature information are employed. In an exemplary embodiment, the lookup tables are preloaded into the memory 202. For example, in FIG. 4, the processor 204 reads the current, voltage, and temperature information stored in memory 202. The processor 204 averages all the current measurements for each charge or discharge cycles to obtain an average current measurement. The processor 204 averages all the voltage measurements for each charge or discharge cycles to obtain an average voltage measurement. The processor 204 averages all the temperature measurements for each charge or discharge cycles to obtain an average temperature measurement. The processor 204 compares the average current, voltage, and temperature measurements to data in the lookup tables stored in memory 202 to obtain a state of health estimation.

It should be noted that the determination of the SOH battery characteristic is not limited to the use of the method 500. For example, other methods to determine the SOH battery characteristic may be utilized within the scope of the embodiments. For additional information on determining state of health of the battery 102, see: (1) U.S. Pat. No. 8,258,751, entitled "Method And System For Tracking Battery State-Of-Health Based On Charging Information," filed Jan. 23, 2008, by Esnard; (2) U.S. Pat. No. 8,269,502, entitled "Method For Determining The State Of Health Of A Battery Using Determination Of Impedance And/Or Battery State," filed Mar. 23, 2010, by Desprez et al.; (3) U.S. Pat. No. 8,531,158, entitled "Method And Apparatus For Assessing Battery State Of Health," filed Nov. 1, 2010, by Wang et al.; (4) U.S. Patent Publication Number 2011/0060538, entitled "Estimation Of State-Of-Health In Batteries," filed Sep. 7, 2010, by Fahimi et al.; and (5) U.S. Patent Publication Number 2011/0148424, entitled "Apparatus For Estimating Battery State Of Health," filed Nov. 30, 2010, by Chiang et al. The entire subject matter of each of these patent documents is incorporated herein by reference.

Figure 6:
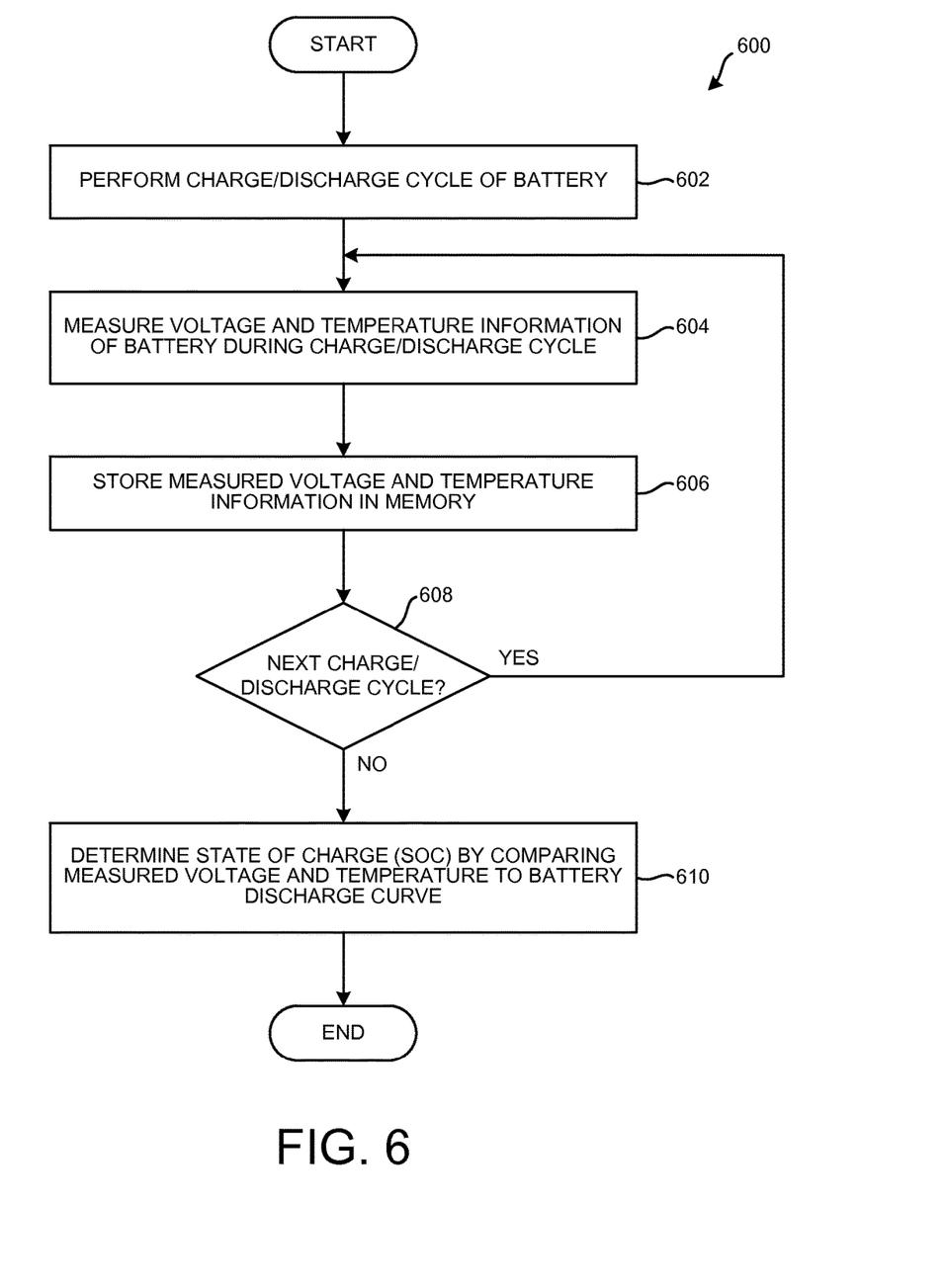
FIG. 6 shows an exemplary embodiment of a method for determining state of charge of a battery.

FIG. 6 shows an exemplary embodiment of a method 600 for estimating state of charge of a battery. For example, the method 600 is suitable for use with the battery characteristics detection circuitry 110 to determine a SOC characteristic of the battery 102. State of charge represents the remaining charge left in the battery. The state of charge indicates when the battery should be charged. In an exemplary embodiment, the state of charge is represented as a numeric percentage value. In one example, the battery characteristic detection circuitry 110 determines the state of charge of the battery 102 in accordance with the method 600 as set forth below.

At block 602, perform one or more charge or discharge cycles of a battery. For example, the PMU 206 controls the battery 102 to be charged or discharged by a selected amount for a selected duration. For example, the PMU 206 performs a charge cycle by applying a charging voltage/current received from an external charger to the battery 102. The PMU 206 performs a discharge cycle by connecting the output of the battery 102 to an internal load that discharges the battery's power. Both the charging and discharging cycles are performed for selected time durations.

At block 604, voltage and temperature information of the battery are measured during (or after) the charge or discharge cycle of the battery. In one embodiment, only voltage is measured. For example, in FIG. 4, the amplifier 408 of the voltage sensing circuit 304 measures voltage between the positive and negative terminals of the battery 102. The amplifier 402 of the temperature sensing circuit 302 measures temperature of the battery 102 via temperature sense resistor 224.

At block 606, the measured voltage and temperature information of the battery are stored in memory. For example, in FIG. 4, the processor 204 receives the voltage information of the battery 102 from ADC 208 and stores the voltage information in memory 202. The processor 204 receives the temperature information of the battery 102 from ADC 208 and stores the temperature information in memory 202.

At block 608, a determination is made whether to enter another charge or discharge cycle to obtain additional battery measurements. In one embodiment, at least three charge or discharge cycles are utilized in the method 600. If additional battery measurements are to be obtained, then the method 600 proceeds to block 604. If no additional battery measurements are to be obtained, then the method 600 proceeds to block 610 for processing of the stored measurements. For example, in FIG. 4, the processor 204 determines whether or not to obtain additional voltage and temperature measurements of the battery 102.

At block 610, the state of charge of the battery is determined by comparing the measured voltage and temperature information to a battery discharge curve that is stored in the memory 202. A battery discharge curve for a particular battery chemistry indicates how battery voltage varies according to state of charge for a given temperature. The measured voltage and temperature information is compared to the discharge curve to obtain the state of charge determination. In one embodiment, only voltage information is used to determine state of charge by using the discharge curve. For example, in FIG. 4, the processor 204 reads the voltage and temperature information stored in memory 202. The processor 204 averages all the voltage measurements for each of the charge or discharge cycles to obtain an average voltage measurement. The processor 204 averages all the temperature measurements for each of the charge or discharge cycles to obtain an average temperature measurement. The processor 204 compares the average voltage and temperature measurements to the discharge curve stored in memory 202 to obtain a state of charge determination.

It should be noted that the determination of the SOC battery characteristic is not limited to the use of the method 600. For example, other methods to determine the SOC battery characteristic may be utilized within the scope of the embodiments. For additional information on determining state of charge of the battery 102, see: (1) U.S. Pat. No. 8,264,202, entitled "Method And Apparatus For Determining State Of Charge Of A Battery Using An Open-Circuit Voltage," filed Oct. 9, 2009, by Sahu et al.; (2) U.S. Pat. No. 8,918,300, entitled "Apparatus And Method For Battery State Of Charge Estimation," filed Oct. 2, 2012, by Baba et al.; (3) U.S. Pat. No. 8,321,164, entitled "Method And System For Determining A State Of Charge Of A Battery Based On A Transient Response," filed Sep. 25, 2008, by Liu et al.; (4) U.S. Pat. No. 8,447,544, entitled "Method And Apparatus For Detecting State Of Charge Of Battery," filed Jan. 31, 2011, by Hsu et al.; and (5) U.S. Patent Publication Number 2012/0105009, entitled "Systems And Methods For Determining Battery State Of Charge" filed Jul. 23, 2009, by Yao. The entire subject matter of each of these patent documents is incorporated herein by reference.

Figure 7:
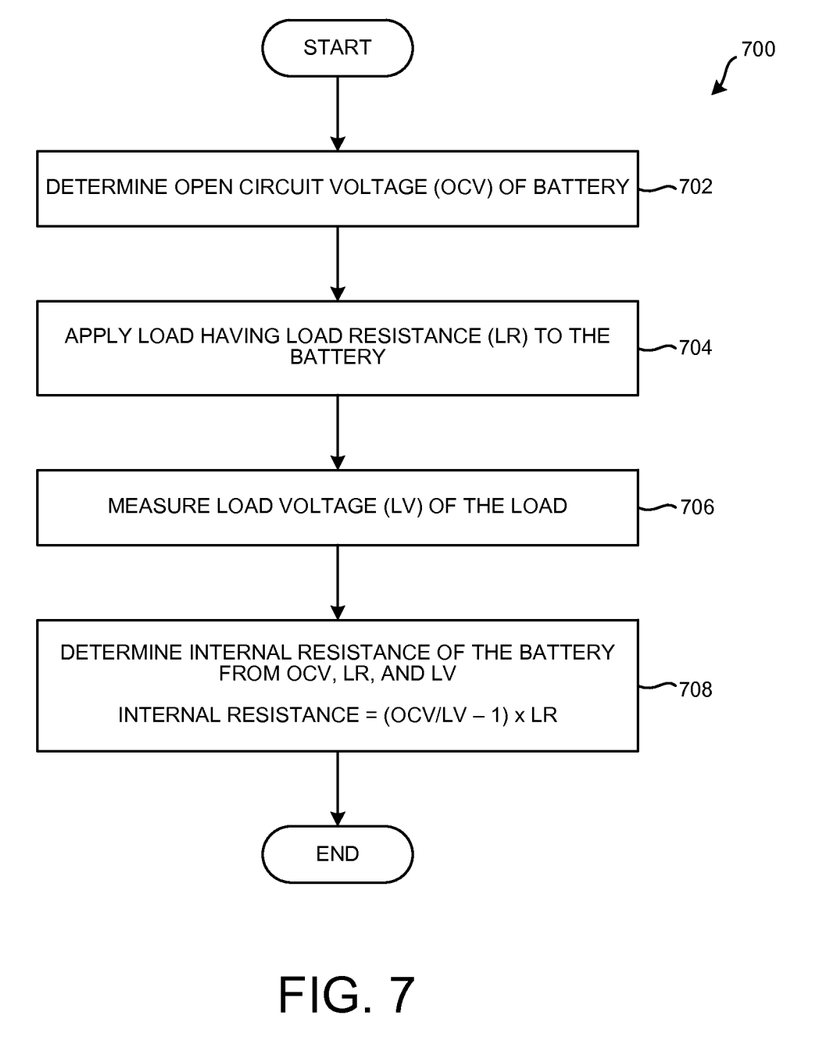
FIG. 7 shows an exemplary embodiment of a method for determining the internal resistance of a battery.

FIG. 7 shows an exemplary embodiment of a method 700 for estimating the internal resistance of a battery. For example, the method 700 is suitable for use with the battery characteristics detection circuitry 110 to determine an internal resistance characteristic of the battery 102. In an exemplary embodiment, battery characteristics detection circuitry 110 determines the internal resistance of the battery 102 in accordance with the method 700 as set forth below.

At block 702, an open circuit voltage (OCV) of the battery is determined. The OCV is a measurement of the voltage between battery terminals when the battery is disconnected from a load. For example, in FIG. 4, the amplifier 408 of the voltage sensing circuit 304 measures voltage between the positive and negative terminals of the battery 102 when the battery 102 is disconnected from the load. In an exemplary embodiment, the PMU 206 disconnects the battery 102 from any internal load or the load presented by other device electronics connected at 214.

At block 704, a load having a load resistance (LR) is applied to the battery. For example, in FIG. 4, the PMU 206 causes a test load to be applied to the battery 102.

At block 706, a load voltage (LV) of the load is measured. For example, in FIG. 4, the PMU 206 measures the voltage across the test load that is applied to the battery 102.

At block 708, internal resistance of the battery is estimated from OCV, LR, and LV. In one embodiment, the internal resistance is determined by evaluating the following equation $(OCV/LV-1) \times LR$. For example, in FIG. 4, the processor 204 estimates the internal resistance of the battery 102 from the measured OCV and LV using the equation, $(OCV/LV-1) \times LR$.

It should be noted that the determination of the internal resistance of the battery is not limited to the use of the method 700. For example, other methods to determine the internal resistance of the battery may be utilized within the scope of the embodiments.

Figure 8:
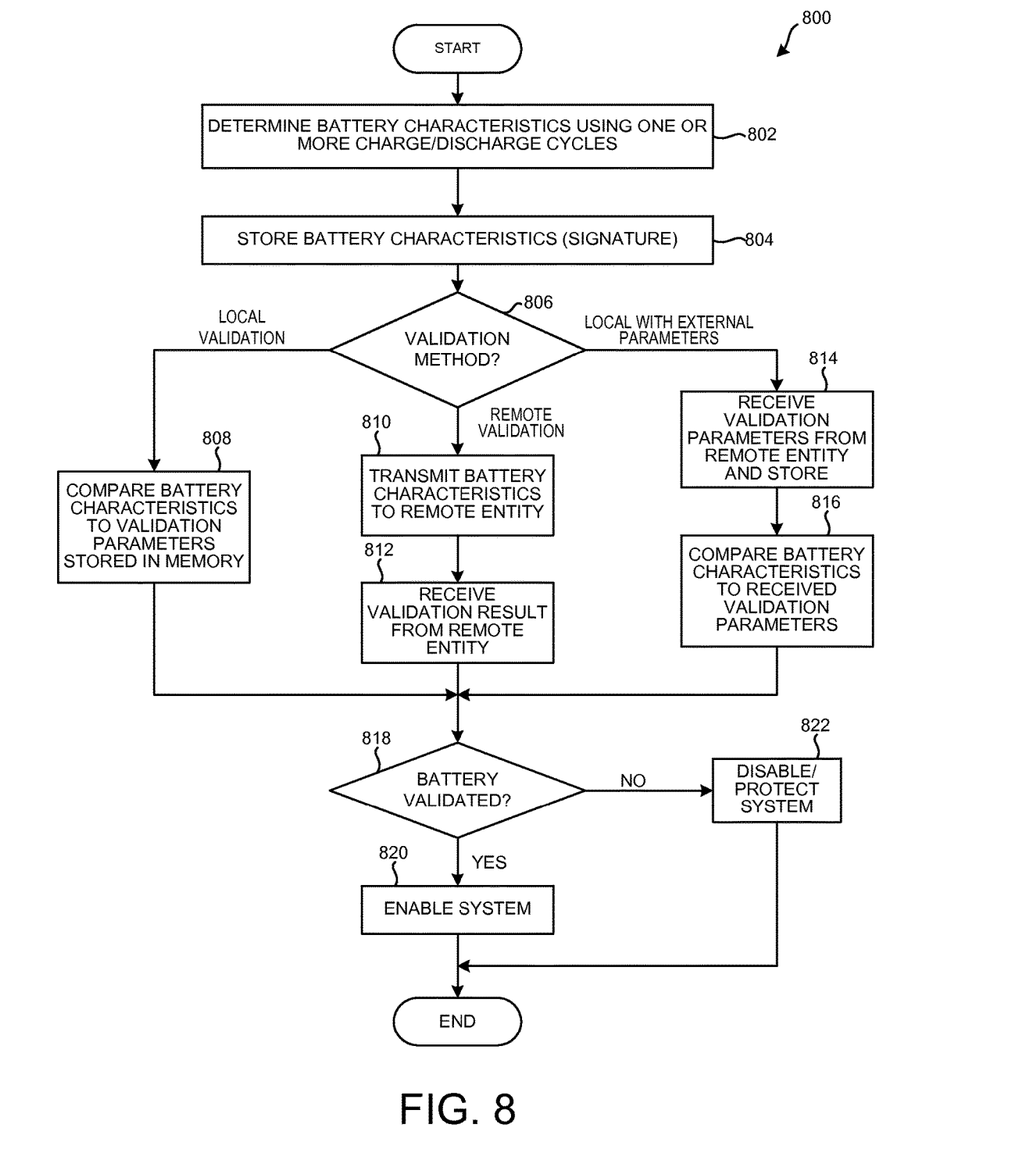
FIG. 8 shows an exemplary embodiment of a method for validating a battery.

FIG. 8 shows an exemplary embodiment of a method 800 for validating a battery. By validating the battery, the origin of the battery is determined and the battery is determined to be either authentic or counterfeit. In an exemplary embodiment, the battery 102 is validated in accordance with the method 800 as set forth below.

At block 802, battery characteristics of a battery are determined in one or more charge or discharge cycles. The battery characteristics include the state of health, state of charge, internal resistance, relaxation time, and impedance of the battery terminals for a given current. For example, in FIG. 4, the battery characteristic detection circuitry 110 determines battery characteristics of the battery 102 as set forth in methods 500, 600, and 700. The battery characteristics are not limited to the characteristics described above such that other characteristics may be determined within the scope of the embodiments.

At block 804, the determined battery characteristics are stored in memory. For example, in FIG. 4, the processor 204 stores the battery characteristics of the battery 102 in memory 202.

At block 806, a determination is made whether the battery is validated locally, remotely, or locally with externally received parameters. If it is determined that the battery is to be validated locally, then the method 800 proceeds to block 808. If it is determined that the battery is to be validated remotely, then the method 800 proceeds to block 810. If it is determined that the battery is to be validated locally with externally received parameters, then the method 800 proceeds to block 814. For example, in FIG. 4, the processor 204 determines whether the battery 102 is to be validated locally, remotely by the battery validation server system 106, or locally with externally received parameters received from the battery validation server system 106.

At block 808, in a local validation process, the battery characteristics are compared to validation parameters stored in local memory. The memory is programmed with the predetermined ranges for the characteristics depending on the specific battery that is to be used. The predetermined ranges are also referred to as validation parameters. The measured battery characteristics are compared with the stored validation parameters to determine whether the battery is authentic. The validation parameters of the battery characteristics would be initially programmed at the factory or updated regularly. The values would be specific for each manufacturing lot of a battery. For example, in FIG. 4, the memory 202 includes a preloaded set of validation parameters. The processor 204 compares the measured battery characteristics of battery 102 to the validation parameters. If the measured battery characteristics of battery 102 are within the ranges of the validation parameters, then the battery 102 is validated as authentic.

At block 810, in a process of remote validation, the measured battery characteristics are transmitted to a remote entity for validation. The remote entity operates a remote server or database system that performs the validation. The battery characteristics are transmitted to the remote entity for comparison against a known set of values from manufacturer data for known, good batteries. Each manufacturing batch of batteries has a signature of particular battery characteristics, for example, state of health, state of charge, internal resistance, relaxation time, or impedance. A tested battery that has this signature can be authenticated as having originated from the manufacturer that made the manufacturing batch of batteries. The known values for the battery characteristics are the same for all batteries in a factory battery lot. For example, in FIG. 1, device 104 communicates the measured battery characteristics over the network 108 to the battery validation server system 106 via communication 124. The communication module 116 of the battery validation server system 106 receives the measured battery characteristics. The processor 112 of the battery validation server system 106 validates the battery 102 by comparing the measured battery characteristics to validation parameters 122 stored in memory 120. The validation result is successful if the processor 112 determines that the measured battery characteristics are within the ranges of validation parameters 122. On the other hand, the validation result fails if the processor 112 determines that the measured battery characteristics are not within the ranges of validation parameters 122.

At block 812, the validation result is received from the remote entity. For example, in FIG. 1, the device 104 receives the validation result from the battery validation server system 106 via communication 126.

At block 814, validation parameters are received from a remote entity and stored. The battery characteristics are to be validated locally using the validation parameters received from the remote entity. For example, in FIG. 1, the device 104 receives validation parameters 122 from the battery validation server system 106 via network 108. The validation parameters 122 are stored in memory 202.

At block 816, the battery characteristics are compared to the received validation parameters. For example, in FIG. 4, processor 204 compares the measured battery characteristics to the validation parameters 122 received from the battery validation server system 106. The validation result is successful if the processor 204 determines that the measured battery characteristics are within the ranges of validation parameters 122. On the other hand, the validation result fails if the processor 204 determines that the measured battery characteristics are not within the ranges of validation parameters 122.

At block 818, a determination is made as to whether the battery is validated. For example, the processor 204 either receives the validation result from the remote server 106 or generates the validation result locally. If battery validation was successful, then the method 800 proceeds to block 820 where the system is enabled. If, however, battery validation fails, then the method 800 proceeds to block 822 where the system is disabled or protected. For example, in FIG. 4, processor 204 determines whether the battery 102 was successfully validated.

At block 820, the system is enabled as a result of the battery being validated. For example, in FIG. 4, processor 204 proceeds to normal operating mode after the battery 102 is successfully validated.

At block 822, the system is disabled or protected as a result of the battery failing validation. In one embodiment, the system is disabled after the battery fails validation to avoid potential damage to the system due to the counterfeit battery. In another embodiment, the system enters a protection mode after the battery fails validation. In the protection mode, the user is warned that the battery is not authentic. In another embodiment, the protection mode presents the user with a counter indicating an amount of time (for example, hours or days) the user has to replace the counterfeit battery with an authentic battery before the system will be disabled. In yet another embodiment, the protection mode links the user to a web page where the user can purchase an authentic battery. The web page lists authentic batteries available for purchase ordered by the lowest price and nearest geographical location. For example, in FIG. 4, processor 204 proceeds to disable the device 104 after validation of the battery 102 fails.

Although certain specific exemplary embodiments are described above in order to illustrate the invention, the invention is not limited to the specific embodiments. For example, in the event that a particular measurement is sensitive, a polling method is used to "vote" for the most likely valid value (2 out of 3, 5 out of 7, etc.). The values of the characteristics are recorded. In addition, additional steps should be taken to ensure that counterfeit batteries are not installed once the system is running. Sudden changes in the value ranges of battery characteristics will indicate either that the battery has been swapped, or that some significant deterioration has occurred.

The system 100 can also be used with old or used batteries that are not counterfeit. The expected battery characteristics of old or used batteries can also be determined with the data collection methods similar to those mentioned above (empirical, mathematical, simulation, etc.). Again, a few charging or discharge cycles can be used to determine the battery characteristics. Then the measured values from the old or used batteries are compared as described above with the internally stored or remotely acquired expected value ranges. Accordingly, various modifications, adaptations, and combinations of various features of the described embodiments can be practiced without departing from the scope of the invention as set forth in the claims.

What is claimed is:

1. A method comprising:
   (a) measuring a plurality of battery characteristics of a battery, wherein the battery supplies an electronic device;
   (b) wirelessly communicating the battery characteristics measured in (a) from the electronic device to a battery validation system, wherein the battery validation system is external to the electronic device, and wherein the battery validation system stores validation parameters used to determine an origin of the battery; and
   (c) receiving a validation result from the battery validation system onto the electronic device, wherein the validation result is obtained by comparing the battery characteristics measured in (a) to the validation parameters stored in the battery validation system of (b).

2. The method of claim 1, wherein the origin represents a manufacturer identity or a manufacturing lot identity.

3. The method of claim 1, further comprising:
   (d) enabling a protection mode if the battery characteristics are not validated by the battery validation system.

4. The method of claim 1, wherein the plurality of battery characteristics comprises at least one of: a state of health (SOH) characteristic, a state of charge (SOC) characteristic, and an internal resistance characteristic.

5. The method of claim 1, wherein the battery is a Lithium Ion battery.

6. The method of claim 1, wherein the battery characteristics include an identifier that identifies a battery type, and wherein the battery validation system uses the identifier to identify which of the validation parameters to use in validating the battery.

7. The method of claim 1, wherein the wirelessly communicating of the battery characteristics to the battery validation system in (b) involves the device communicating the battery characteristics and an identifier to the battery validation system over a wireless network, and wherein the identifier is associated with the battery and indicates a battery type.

8. The method of claim 1, wherein the battery validation system generates the validation result by determining whether the battery characteristics are within a range defined by the validation parameters stored in the battery validation system.

9. The method of claim 1, wherein the communicating of (b) and the receiving of (c) involve communications over a cellular network.

10. An electronic device comprising:
    a battery that supplies the electronic device; and
    a battery characteristics detection circuit that senses battery characteristics of the battery, wherein the battery characteristics indicate battery origin; and
    a communication interface that communicates wirelessly with a validation system, wherein the validation system is remote with respect to the electronic device, wherein the validation system stores battery validation parameters, and wherein the battery of the electronic device is validated by comparing the battery validation parameters stored in the validation system to the battery characteristics sensed by the battery characteristics detection circuit.

11. The electronic device of claim 10, wherein the battery characteristics comprise at least one of: a state of health (SOH) characteristic, a state of charge (SOC) characteristic, and an internal resistance characteristic.

12. The electronic device of claim 10, wherein the electronic device communicates wirelessly the battery characteristics sensed by the battery characteristics detection circuit to the validation system, wherein the validation system compares the measured battery characteristics to the validation parameters stored in the validation system, and wherein the electronic device receives a validation result from the validation system via a wireless network.

13. The electronic device of claim 10, wherein the battery characteristics detection circuit comprises:
    a power management unit (PMU) that charges and discharges the battery;
    an analog-to-digital converter (ADC) that generates a digital signal for each measured battery characteristic; and
    a processor that protects the electronic device if the battery characteristics of the battery are outside the range defined by the validation parameters stored in the validation system.

14. An electronic device comprising:
    a battery that supplies the electronic device; and
    a battery characteristics detection circuit that senses battery characteristics of the battery; and
    a communication interface that communicates wirelessly with a validation system, wherein the validation system is remote with respect to the electronic device, wherein the validation system stores battery validation parameters, wherein the battery of the electronic device is validated by comparing the battery validation parameters stored in the validation system to the battery characteristics sensed by the battery characteristics detection circuit, wherein the validation parameters are received from the validation system onto the electronic device, and wherein the sensed battery characteristics of the battery are compared to the validation parameters locally.

15. An apparatus, comprising:
    a communication interface configured to communicate with a remote system over a wireless network, wherein the remote system stores valid battery operating property ranges; and
    means for determining operating properties of a battery, wherein the operating properties of the battery are used to validate an identity of the battery by comparison of the operating properties to the valid battery operating property ranges stored by the remote system.

16. The apparatus of claim 15, wherein the means is a battery characteristic detection circuit that includes a processor, a power management unit (PMU), an instrumentation circuit, an analog-to-digital converter (ADC), and a memory.

17. The apparatus of claim 15, wherein the operating properties of the battery comprise at least one of: a state of health (SOH) characteristic, a state of charge (SOC) characteristic, and an internal resistance characteristic.

18. The apparatus of claim 15, wherein the means is also for receiving the valid battery operating property ranges from the remote system over the wireless network and comparing the operating properties of the battery to the received valid battery operating property ranges.

19. The apparatus of claim 15, wherein the means is also for communicating the determined operating properties of the battery to the remote system over the wireless network and receiving a validation result from the remote system.

* * * * *